United States Patent [19]
Grubb

[11] Patent Number: 5,252,429
[45] Date of Patent: Oct. 12, 1993

[54] PROCESS OF COLOR DEVELOPMENT USING PEARLESCENT TONERS HAVING REDUCED STAIN CHARACTERISTICS

[75] Inventor: Eugene L. Grubb, Colts Neck, N.J.

[73] Assignee: E. I. Du Pont de Nemours and Company, Wilmington, Del.

[21] Appl. No.: 2,246

[22] Filed: Jan. 8, 1993

Related U.S. Application Data

[62] Division of Ser. No. 695,825, May 6, 1991, Pat. No. 5,194,366.

[51] Int. Cl.$^5$ ................................................ G03C 5/00
[52] U.S. Cl. .................................. 430/291; 430/292; 430/331
[58] Field of Search ............... 430/291, 292, 331, 905, 430/107, 108, 109, 110

[56] References Cited

U.S. PATENT DOCUMENTS

| | | | |
|---|---|---|---|
| 3,620,726 | 11/1971 | Chu et al. | 96/27 R |
| 3,909,282 | 9/1975 | Gray | 106/288 Q |
| 4,010,293 | 3/1977 | Davis | 427/214 |
| 4,205,997 | 6/1980 | Hesse et al. | 106/308 Q |
| 4,330,613 | 5/1982 | Fickes | 430/291 |
| 4,544,415 | 10/1985 | Franz et al. | 106/288 R |
| 4,546,072 | 10/1985 | Matrick | 430/449 |
| 4,565,773 | 1/1986 | Matrick | 430/331 |
| 4,772,331 | 9/1988 | Noguchi et al. | 106/417 |

*Primary Examiner*—Jack P. Brammer

[57] ABSTRACT

Undesired stain is minimized for pearlescent toners, adapted for toning elements having non-tacky and tacky areas that define an image, by including in the toner inert, substantially spherical particles having a particle size of approximately 0.3 to 42 microns and by including a slip-agent surface coating on at least the pearlescent pigment particles, and preferably also on the inert, substantially spherical particles.

11 Claims, No Drawings

PROCESS OF COLOR DEVELOPMENT USING PEARLESCENT TONERS HAVING REDUCED STAIN CHARACTERISTICS

This is a division of application Ser. No. 07/695,825 filed May 6, 1991, now U.S. Pat. No. 5,194,366.

FIELD OF THE INVENTION

This invention relates to dry nonelectroscopic toners. More particularly this invention relates to dry nonelectroscopic pearlescent toners having reduced stain characteristics. Further, this invention relates to a process for color development of a surface having imaged tacky and non-tacky areas with dry nonelectroscopic pearlescent toners.

BACKGROUND OF THE INVENTION

Reproduction processes are known wherein positive-working photopolymerizable elements and negative-working photosensitive elements are exposed imagewise (e.g., through a phototool) to form non-tacky and tacky image areas. For example, positive-working photopolymerizable elements are described in Chu and Cohen U.S. Pat. No. 3,649,268, and negative-working photosensitive elements are described in Cohen and Fan U.S. Pat. Nos. 4,174,216 and 4,191,572. The image is developed by toning with a suitable toner that selectively adheres to the tacky image areas. Excess toner, which may be present, is then removed from the non-tacky areas. The resulting image is a proof of the original, or can be used in a transfer process to place the image on another surface. Multilayer proofs, such as surprint proofs, can be made by repeating the process steps with different phototools and colored toners.

In view of the increasing importance of proof-making in the printing industry, improved toners and applicators for applying these toners are desired. Some improvements in toners are described in U.S. Pat. No. 3,620,726 to Chu and Manger, which discloses pigmented cellulose acetate toner particles; U.S. Pat. No. 3,909,282 to Gray, which discloses mixtures of those toners with silica particles; U.S. Pat. Nos. 4,330,613 and 4,397,941 to Fickes, which disclose pigmented cellulose acetate toners surface coated with an antistatic agent and a slip agent; and U.S. Pat. Nos. 4,565,773 and 4,546,072 to Matrick, which disclose toners similar to those of Fickes, but employing polydimethyl siloxanes and polymeric quarternary compounds as the antistatic agent.

Application of any of the above described toners, as well as other prior art toners, to tacky image areas of photosensitive elements may present a problem in that it is difficult to completely remove the toner from the non-tacky areas of the elements. After cleanup, some undesirable stain is usually present in the non-tacky areas. The term "background color" as used herein refers to the color present in the non-tacky background areas of an exposed and toned positive-working or negative-working photosensitive element prior to any step being taken to remove toner excess therefrom. Background color is the sum of two components: "stain", which is the color not removed from the background color areas by exhaustive wiping of the areas; and "clean-up", which is the color that may be removed from the background color areas by wiping, air impingement, or the like.

It is known to add silicone oil to the above described toners to improve their stain characteristics. However, the addition of silicone oil does not readily reduce the stain of pearlescent pigments to the industry accepted level of approximately 0.5 or less. Thus, there is a need for improved pearlescent toners.

SUMMARY OF THE INVENTION

The present invention provides a dry nonelectroscopic pearlescent toner having a stain value less than approximately 0.5, the toner consisting essentially of a mixture containing:

(a) up to approximately 99.9% of pearlescent pigment particles surface-coated with a slip agent, and (b) approximately 0.1% to 10% of inert, substantially spherical particles having a particle size of approximately 0.3 to 4.2 microns.

This invention also provides a process for color development of a surface having imagewise tacky and non-tacky areas comprising the steps of:

(a) applying to the image-bearing surface dry nonelectroscopic pearlescent toner described above, (b) distributing the toner particles over the image surface whereby the distributed toner particles become embedded solely in the tacky image areas, and (c) physically removing toner particles from the non-tacky areas to leave the non-tacky areas substantially free of the toner particles.

DETAILED DESCRIPTION OF THE INVENTION

The improved dry pearlescent toners of the invention are nonelectroscopic and comprise a pearlescent pigment surface coated with a slip agent and inert substantially spherical particles having a particle size of 0.3 to 42 microns. Nonelectroscopic means that the toners are neither repelled from nor attracted to a charged rod when it is placed in close proximity to the toner particles.

PEARLESCENT PIGMENTS

Pearlescent pigments (also known as "nacreous pigments") were named for their pearly luster appearance. Pearlescent pigment particles are thin transparent platelets having high refractive index that partially reflect and partially transmit light. When the reflecting platelets are of appropriate thickness to produce color by light interference, the pearlescent pigments are also interference pigments. Light reflection from many layers of oriented platelets creates a sense of depth that is characteristic of pearlescent color.

Man-made pearlescent pigments often consist of mica having a coating of titanium dioxide or iron oxide. The $TiO_2$ and iron oxide provide the necessary high refractive index and the mica platelet provides the plate-like shape. Colorants can be added on top of the $TiO_2$/iron oxide surface. The mica has no effect upon the optics of pearlescent pigments. It is simply a flat substrate upon which $TiO_2$ or iron oxide is deposited. The process of depositing and curing the $TiO_2$ or iron oxide gives a crystalline layer with high refractive index on both sides of the mica.

The iron oxide coated pigments by themselves give metallic-like appearance. The $TiO_2$ coated pigments are pearlescent but lacking in real metallic appearance. However, by addition of small amounts of colorants such as carbon black to the $TiO_2$-coated pigments highly metallic-like colorations can be produced. The added colorant (typically carbon black) greatly enhances the color due to the transparency of the pearlescent pigment particles which permit in-depth light reflection. The carbon black pigment is usually embedded as a precipitated layer on the coated pearlescent flakes as disclosed in U.S. Pat. No. 4,076,551. Representative pearlescent pigments that may be selected in practicing the invention are disclosed in U.S. Pat. Nos. 3,071,482; 3,087,828; 4,416,403; 4,038,099; 4,047,969; 4,755,229; and 4,968,351.

SLIP AGENTS

Slip agents that are useful for coating the pearlescent pigment generally are materials that boil above 100° C. Particularly useful slip agents are selected from the group consisting of silicone oil having a weight average molecular weight of about 230 to 50,000; saturated hydrocarbons having a weight average molecular weight of approximately 200 to 10,000; and fluorocarbon compounds having a weight average molecular weight of 500 to 500,000. In addition to surface coating the pearlescent pigment, these slip agents also may be used to surface coat the particulate material. However, it is important that the selected slip agent does not dissolve or react with the pearlescent pigment or the particulate material.

Useful Silicone oils include: polydimethylsiloxane and polymethyl (X) siloxane wherein X is an alkyl chain with 2 to 12 carbon atoms; e.g., ethyl to dodecyl. Saturated hydrocarbons that may be selected include: motor lubricating oil, SAE 10, with a paraffin oil viscosity at 55° C. of 70 cps using a Brookfield Viscometer; paraffin wax ranging in chain length from 20 to 24 carbon atoms; and polyethylene waxes having a molecular weight in the range of 1500 to 10,000. Useful fluorinated hydrocarbons include: fluorocarbon oil, such as a polymer of $(CF_2CFCl)X$ wherein X is 6 to 10; and polytetrafluoroethylene compounds having the formula $[CF_2-CF_2]X$, wherein X is a number of 6 to 10.

Silicone oil is the preferred slip agent. The slip agent, when a liquid at normal room temperature, is a nonsolvent for the toner, nonvolatile, and stable to aerial oxidation. It is used in the amount of at least 1% by weight, preferably 2 to 10% by weight, based on the total weight of the toner.

PARTICULATE MATERIALS

The particulate material has an average particle size of approximately 0.3 to 42 microns, and, preferably 2 to 15 microns. The particle size can be measured, for example, by a Coulter Counter, Coulter Electronics Inc. Hialeah, Fla. Preferably, particulate materials are selected that absorb oil in the amount of at least 2% by weight, preferably 2-10%, as determined by the Gardner-Coleman Method, ASTM D-1483-60. Such materials include: starches, such as corn or rice starch; diatomaceous silicas, such as those produced by John-Manville Products Corp. under the trademark Celite®, Superfloss® and Celite® White Mist; cellulose acetate; silica-gel; vegetable powders, such as those sold by Holland Ink Corp., Mineola, N.Y., under the trademark Van-Son®; titanium dioxide; mixtures of titanium dioxide and cellulose acetate that give white coloration and high opacity; and mixtures thereof. The particulate materials are added in the amount of less than 10%, preferably 0.1 to 5%, based on the total weight of the toner. The particulate materials are preferably treated with slip agents prior to their addition to the pearlescent toner. The slip agent on the particulate material may be present in the amount of less than 10%, preferably 1 to 5%, based on the total weight of the toner.

ANTISTATIC AGENTS

Pearlescent toners that may be used in automatic toning devices can be further surface coated with antistatic agents to improve their toning characteristics. Suitable antistatic agents are disclosed in U.S. Pat. Nos. 4,330,613, 4,565,773 and 4,546,072. The choice of antistatic agent should be such that the agent does not deleteriously affect the pearlescent pigment or particulate material. Polymeric quaternary ammonium compounds, especially poly(dimethyl diallyl ammonium chloride), are preferred antistatic agents. The antistatic agent typically is present in the amount of 0.1 to 8%, preferably 0.5 to 2.5%, based on the total weight of the toner.

ADDITIVES

Colorant-containing toners may be added to the pearlescent toners to change the overall appearance of the toner. These toners are usually in particulate form, and may be uniformly dispersed with the pearlescent toners by shaking on a paint shaker such as the Red Devil #30, 5400 Paint Conditioner Model MKI-R, Red Devil, Inc., Union, N.J. The amount of colorant-containing toner added determines the particular shading or color intensity of the resulting pearlescent toner. Some useful colorant-containing toners are disclosed in U.S. Pat. Nos. 3,620,726; 3,909,282; 4,215,193; 4,330,613; 4,565,773; and 4,546,072. These toners comprise the colorant and cellulose acetate. The colorant-containing toners may be surface coated with a slip agent and an antistatic agent depending on the proposed application. These toners are usually added in amounts of 0.1 to 15%, preferably 0.1 to 8%, based on the total weight of the toner. Other additives also may be present, provided their presence does not defeat the purposes of the invention.

The pearlescent pigment, coated with a slip agent, will be present in amounts up to 99.9%, by weight. If there are no additives present, other than the inert substantially spherical particles, the pearlescent pigment thus would be present in the range of approximately 90% to 99.9%. If other additives are present, such as colorants, the pearlescent pigment (coated with a slip agent) may be present in amounts down to approximately 80% of the total toner weight.

PEARLESCENT TONER PREPARATION AND PROCESS OF USE

The toner particles are readily made as illustrated in the examples. The antistatic agent and slip agent may be added in either order, or simultaneously, to the pearlescent pigments or particulate materials. This may be generally accomplished in a Patterson Kelley Twin Shell Blender manufactured by Patterson Kelley Co., Division of Harsco Corp., East Stroudsburg, Pa.; or in a Red Devil #30, 5400 Paint Conditioner Model MKI-R, Red Devil, Inc., Union, N.J. Other comparable blending devices can be used. The blending is for at least 5 minutes, up to 30 minutes or longer. After blending the particles are permitted to dry in ambient air, or may be dried using conventional equipment.

The toners are useful for color development of a surface having imagewise tacky and non-tacky areas. The toner particles are distributed over the entire imaged surface, and become embedded solely in the tacky image areas. The remaining toner particles then are physically removed, such as by wiping with a suitable cloth or clean-up section of a toning apparatus. The non-tacky areas are substantially free of the toner particles.

The tacky surface is present in (a) a photopolymerizable layer (i.e., positive-working wherein the exposed areas become photohardened) such as those disclosed in U.S. Pat. No. 3,649,268 to Chu et al.; (b) an imagewise exposed photosensitive layer, generally containing a thermoplastic binder and a photosensitive system, consisting essentially of:

I. at least one dihydropyridine compound of the formula

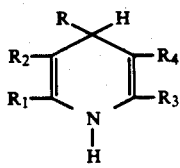

wherein R is alkyl, alkenyl of 3 to 11 carbon atoms, phenylalkyl, phenylalkenyl; unsubstituted aryl of 6 to 10 carbon atoms, and heteroaryl, $R_1$ and $R_2$, which can be the same or different, are alkyl, and $R_3$ and $R_4$, which can be the same or different, are COOR', COR', CN,R' is alkyl; and II. at least one hexaarylbiimidazole compound, (i.e., negative-working wherein the exposed areas are tacky) as disclosed in U.S. Pat. No. 4,243,741 to Abele and Grossa, or (c) in an imagewise exposed element containing nontonable image areas and tacky nonphotosensitive image areas, as disclosed in U.S. Pat. No. 4,174,216 to Cohen and Fan. Other systems can be used provided that tacky and non-tacky image areas are formed thereby. The tacky and non-tacky image areas in these systems can be formed either directly, e.g., by exposure to actinic radiation or by treatment with solutions, heat or other means to obtain tacky image areas.

The above toned elements may be used to form overlays, or to form surprint multicolor proofs as described below by laminating at least one other tonable photoimageable layer over the previously imagewise toned layer. Each tonable layer is exposed through a different color separation transparency, and the respective layer is colored or developed with toners in a spectral region corresponding to the color separation transparency used for exposure. In most cases four photoimaged toned elements are present in a surprint proof, the toned elements and separation transparencies corresponding respectively to yellow, magenta, cyan and black. The pearlescent pigment toned layer is preferably the outermost layer in the surprint proof. Toners described in Fickes, U.S. Pat. Nos. 4,397,941 and 4,330,613, and Matrick, U.S. Pat. Nos. 4,565,773 and 4,546,072, are useful in toning the yellow, magenta, cyan and black layers.

An alternate use involves automatic color development of a surface having imagewise tacky and non-tacky areas by dispensing and embedding dry particulate toners on the surface by means of an automatic toning apparatus having a dispenser for dispensing said toner above said surface, an applicator for embedding said particulate toners in said surface, and means for moving the tacky surface past the dispenser and the applicator. The dispenser generally consists of a hopper having an independently movable side wall, and means to oscillate the side wall laterally of the tacky surface, thereby supplying the particulate material to the surface at a uniform, controlled rate.

INDUSTRIAL APPLICABILITY

The dry nonelectroscopic toners are useful for application to positive- or negative-working tacky photosensitive surfaces or tacky nonphotosensitive surfaces in multilayer photosensitive elements used to prepare color proofs, such as overlays and surprints. The toners are particularly useful for the preparation of color proofs and can be used in conjunction with a toning apparatus, e.g., automatic toning apparatus described in U.S. Pat. No. 4,069,791 to Tobias without the need for a cleanup section. The toners are easily prepared and exhibit good toning. The proofs obtained are substantially stain free in the non-tacky areas.

EXAMPLES

The following examples further illustrate, but do not limit, the invention. The parts and percentages are by weight unless otherwise noted.

L*a*B* values set forth in the examples are calculated using the equations set forth on page 63, under the discussion of 1976 CIE L*a*b* (CIELAB system) in F. W. Billmeyer, and M. Saltzman "Principles of Color Technology," 2nd Edition 1981. After substracting the L*a*b* values for the area under the stain patch from the L*a*b* values for non-tacky areas exposed to toner, ΔE is calculated using the following equation:

$$\Delta E = \sqrt{(\Delta L^*)^2 + (\Delta a^*)^2 + (\Delta b^*)^2}$$

EXAMPLES 1–6

Pearlescent bronze toner was prepared from Mearlin Golden Bronze 9240A, manufactured by the Mearl Corporation, New York, N.Y., which is comprised largely of mica (CAS No. 12001-26-2) and titanium dioxide (CAS No. 13463-67-7). The toner was prepared by placing the pigment, dimethyl polysiloxane, silicone oil slip agent, 200-Fluid C.S. (Dow Corning Co., Midland, Mich.) and Merquat ® 100 solution, Merck Co., Rahway, N.J., in the amounts shown in Table 1, in a Bain Marie along with a few ceramic balls, followed by shaking on a Red Devil Paint Conditioner, Model MKI-R, manufactured by Red Devil, Inc., Union, N.J. for 30 minutes.

This toner was divided into 16 portions. To each portion was added cellulose acetate particles (CA), (Eastman Kodak Co., Rochester, N.Y.) or a 60/40 blend of titanium dioxide particles (E. I. du Pont de Nemours and Co., Wilmington, Del.) and cellulose acetate particles ($TiO_2$/CA) in the amounts shown in Table 1. These ingredients were placed in a Bain Marie along with a few ceramic balls followed by shaking on the Red Devil Paint Conditioner for 30 minutes. The CA and $TiO_2$/CA particles had been treated with 4% silicone oil. The CA particles had a particle size of 0.6 to 42 microns, and the $TiO_2$/CA particles had a particle size of 0.3 to 42 microns.

The toners were tested by the procedure described below:

A negative-working, peel-apart, photopolymerizable element similar to that disclosed in Cohen and Fan, U.S. Pat. Nos. 4,174,216 and 4,247,617, was laminated to Du Pont Catalog Receptor stock (Catalog Receptor Sharp, Grade 3), manufactured by Schoeller Technical Papers, Inc., Pulaski, N.Y. and Rexham Co., Matthews, N.C. The polypropylene cover sheet was removed exposing the unexposed film. A second negative-working, peel-apart photopolymerizable film was laminated to the unexposed film layer, and the element was placed in a Theimer-Montacop® exposure frame (Exposure Systems Co., Bridgeport, Conn.) fitted with a photopolymer lamp (5 kw), and a Kokomo glass filter (No. 400, Kokomo Opalescent Glass Co., Kokomo, Ind.) and given a 25 second imagewise exposure. After this exposure the polypropylene cover sheet was removed, exposing the tacky and non-tacky image and non-image areas. A 1.25 inch (~3.18 cm) square self-sticking label was attached to an unexposed area of the imaged element and the image was developed by manually toning with about 10 passes using a mohair toning pad, the pearlescent toners prepared by the procedure described above. Excess toner was removed using a Las-Stik® cloth (The Las-Stik® Manufacturing Co., Hamilton, Ohio). The label protected the non-receptive area of the element under it from being contacted with toner particles during the toning step. The stain patch was removed after toning the element and results indicated in Table 1 below were obtained using the process described below. A final photopolymer layer similar to that described in Taylor, U.S. Pat. Nos. 4,971,893 and 4,921,776, was laminated onto the toned element and the cover sheet peeled off.

Total background color caused by stain was measured. L* a* b* data was obtained on the area under the stain patch. This value was subtracted from the value obtained in the unprotected, non-receptive or background areas of the toned element. The data was reported as ΔE, calculated as described above; the larger the value the greater the background stain. Measurements were made using the ACS Spectrosensor, manufactured by Applied Color Systems, Princeton, N.J.

TABLE 1

| TONER SAMPLE | SILICONE OIL (%) | MERQUAT® 100 (%) | CA (%) | TiO$_2$/CA (%) | STAIN (ΔE) |
|---|---|---|---|---|---|
| CONTROL 1 | — | — | — | — | 5.5 |
| CONTROL 2 | 3.8 | — | — | — | 2.1 |
| CONTROL 3 | 7.4 | — | — | — | 1.9 |
| CONTROL 4 | 12.2 | — | — | — | 3.2 |
| CONTROL 5 | 9.1 | 2.1 | | | |
| CONTROL 6 | 7.4 | 2 | — | — | 1.2 |
| CONTROL 7 | 10.0 | 2 | — | — | 4.9 |
| CONTROL 8 | 7.4 | 3.4 | — | — | 1.2 |
| CONTROL 9 | 7.4 | 4.3 | — | — | 2.1 |
| CONTROL 10 | 7.4 | 4.8 | — | — | 3.1 |
| EXAMPLE 1 | 7.4 | 2 | 5 | — | 0.2 |
| EXAMPLE 2 | 7.4 | 2 | 10 | — | 0.1 |
| EXAMPLE 3 | 7.4 | 2 | — | 5 | 0.1 |
| EXAMPLE 4 | 7.4 | 2 | — | 10 | 0.0 |
| EXAMPLE 5 | 7.4 | 2 | — | 2 | 0.2 |
| EXAMPLE 6 | 7.4 | — | — | 2 | 0.2 |

EXAMPLE 7

A copper pearlescent toner was prepared and tested as described in Examples 1–6 with the following exception: Mearlin® Copper 9430A, Mearl Corporation, NY, N.Y. was used instead of the Mearlin® Golden Bronze pigment. Results are shown in Table 2.

TABLE 2

| TONER SAMPLE | SILICONE OIL (%) | MERQUAT® 100 (%) | CA (%) | TiO$_2$/CA (%) | STAIN (ΔE) |
|---|---|---|---|---|---|
| CONTROL 11 | — | — | — | — | 21.6 |
| CONTROL 12 | 3.9 | — | — | — | 5.8 |
| CONTROL 13 | 7.4 | — | — | — | 2.0 |
| CONTROL 14 | 12.3 | — | — | — | 3.0 |
| CONTROL 15 | 15.3 | — | — | — | 3.2 |
| CONTROL 16 | 7.4 | 2 | — | — | 2.0 |
| CONTROL 17 | 10.0 | 2 | — | — | 2.7 |
| CONTROL 18 | 8.3 | 3.4 | — | — | 1.9 |
| EXAMPLE 7 | 7.4 | 2 | — | 2 | 0.2 |

EXAMPLE 8

A brass pearlescent toner was prepared and tested as described in Examples 1–6 with the following exceptions: the brass toner had the following composition:

| INGREDIENT | AMOUNT (%) |
|---|---|
| Mearlin® Golden Bronze pigment | 88.5 |
| Black pigment containing toner | 1.0 |
| Silicone oil | 7.4 |
| Merquat® 100 | 2.0 |
| TiO$_2$/CA | 2.0 |

The black pigment containing toner had the following composition:

| INGREDIENT | AMOUNT (%) |
|---|---|
| Sterling® Regal Black, Cabot Corp., Boston, MA | 45.3 |
| Cellulose acetate | 47.3 |
| Silicone oil | 7.4 |

This toner was found to have a stain measurement of 0.2.

EXAMPLE 9

A pearlescent toner comprising the pearlescent pigments mixed with colorant containing toners was prepared and tested as described in Examples 1–8 with the following exceptions:

The pearlescent toner had the following composition:

| INGREDIENT | AMOUNT (%) |
| --- | --- |
| Mearlin ® Golden Bronze pigment surface coated with 7.4% silicone oil and 2% Merquat ® 100 | 52.4 |
| Mearlin ® Mayan Gold pigment surface coated with 5.7% silicone oil and 2% Merquat ® 100 | 42.9 |
| Black pigment containing toner | 1.2 |
| Green pigment containing toner | 1.5 |
| TiO$_2$/CA | 2.0 |

The green pigment containing toner had the following composition:

| INGREDIENT | AMOUNT (%) |
| --- | --- |
| Monolite ® green pigment, Polychloro copper phthalocyanine, CAS # 1328-53-6, ICI Americas, Wilmington, DE | 32.8 |
| Cellulose acetate | 61.6 |
| Silicone oil | 5.6 |

This toner when tested had a stain measurement of 0.2.

EXAMPLE 10

A pearlescent bronze toner was prepared and tested as described in Control 3 with the following exception: 2% cellulose acetate which was not treated with a slip agent or an antistatic agent was added as the particulate material.

This toner was found to give 0.3 stain.

EXAMPLE 11

A 5-color proof was prepared using the following procedure: Successive photopolymer film layers exposed through negative color separations as described in Examples 1-6 were toned with yellow, magenta, cyan and black toners of the type disclosed in U.S. Pat. Nos. 4,565,773 and 4,546,072. A fifth photopolymer layer was exposed as described earlier and then toned with pearlescent gold toner prepared as described in Example 9. The resulting 5-color proof gave a total stain of 0.3.

EXAMPLE 12

A pearlescent toner with intense orange color was prepared using the pearlescent toner of Example 9 to which was added small amounts of yellow, orange and magenta toners made with yellow, scarlet and magenta pigments, respectively. This toner gave an intense orange pearlescent color when applied to exposed photopolymer film. Stain was determined as described earlier and was found to be 0.2.

The toner had the following composition:

| INGREDIENT | AMOUNT (%) |
| --- | --- |
| Gold pearlescent toner (Example 9) | 94.3 |
| Scarlet pigment containing toner | 2.9 |
| Magenta pigment containing toner | 1.9 |
| Yellow pigment containing toner | 0.9 |
| The pigment-containing toners had the following compositions: | |
| Scarlet pigment toner composition: | |
| Dalamar Yellow pigment YT858D from Cookson Pigments Co., Newark, NJ | 5.0 |
| Indofast Brilliant Scarlet R-6300 pigment | 28.4 |
| from Mobay Chemical Corp., Haledon, NJ | |
| Quindo Magenta Quinacridone pigment from Mobay Corp. | 4.6 |
| Cellulose acetate | 54.6 |
| Silicone oil | 7.4 |
| Yellow pigment toner composition: | |
| Dalamar Yellow pigment | 25.3 |
| Indofast Brilliant Scarlet pigment | 0.2 |
| Cellulose acetate | 63.8 |
| Silicone oil | 10.7 |
| Magenta pigment toner composition: | |
| Quindo Magenta pigment | 33.1 |
| Indofast Brilliant Scarlet pigment | 6.4 |
| Cellulose acetate | 52.2 |
| Silicone oil | 8.3 |

What is claimed is:

1. A process for color development of a surface having imagewise tacky and non-tacky areas comprising the steps of:
   (a) applying to said surface a dry non-electroscopic pearlescent toner having a stain value less than approximately 0.5, said toner consisting essentially of a mixture containing:
      (1) up to approximately 99.9% of pearlescent pigment particles surface-coated with a slip agent, and
      (2) approximately 0.1% to 10% of inert, substantially spherical particles having a particle size of approximately 0.3 to 42 microns,
   (b) distributing the toner particles over the image surface whereby the distributed toner particles become embedded solely in the tacky image areas, and
   (c) physically removing toner particles from the non-tacky areas to leave the non-tacky areas substantially free of the toner particles.

2. The process of claim 1 wherein the toner particle component of step (a) (2) is a material that will absorb oil in the amount of at least 2% of the component (a) (2) particle weight.

3. The process of claim 2 wherein the material will absorb oil in the amount of approximately 2 to 10% of the component (a) (2) particle weight.

4. The (a) (2) process of claim 1 wherein the particles of step (a) (2) contain at least one material selected from the group consisting of starch, diatomaceous silica, cellulose acetate, silica-gel, vegetable powder, and titanium dioxide.

5. The process of claim 4 wherein the particles constitute approximately 0.1 to 5% of the total toner weight.

6. The process of claim 1 wherein the component (a) (2) particles contain up to approximately 10% by weight of a slip agent.

7. The process of claim 1 wherein the slip agent on the component (a) (1) particles is a material that boils above 100° C.

8. The process of claim 1 wherein the slip agent on the component (a) (1) particles is selected from the group consisting of silicone oil, saturated hydrocarbons, and fluorocarbon compounds.

9. The process of claim 1 wherein the slip agent is also present on said component (a) (2) particles.

10. The process of claim 9 where the slip agent is silicone oil present in the amount of at least 1% by weight, based on total toner weight.

11. The process of claim 1 wherein a colorant-containing toner is also present in an amount of approximately 0.1 to 15% by weight, based on the total toner weight.

* * * * *